United States Patent [19]

Huang et al.

[11] Patent Number: 5,554,254
[45] Date of Patent: Sep. 10, 1996

[54] POST CONTACT LAYER ETCH BACK PROCESS WHICH PREVENTS PRECIPITATE FORMATION

[75] Inventors: Yuan-Chang Huang; Kuang-Hui Chang, both of Hsin-Chu, Taiwan

[73] Assignee: Taiwan Semiconductor Manufacturing Company, Hsin-Chu, Taiwan

[21] Appl. No.: 405,077

[22] Filed: Mar. 16, 1995

[51] Int. Cl.$^6$ ................................................. H01L 21/306
[52] U.S. Cl. .................................. 156/625.1; 156/634.1; 156/643.1; 216/107; 216/109
[58] Field of Search ........................... 156/625.1, 643.1, 156/634.1; 437/192, 190, 228, 245; 216/109, 107

[56] References Cited

U.S. PATENT DOCUMENTS

| | | | |
|---|---|---|---|
| 4,833,099 | 5/1989 | Woo | 437/41 |
| 5,164,330 | 11/1992 | Davis et al. | 437/192 |
| 5,227,337 | 7/1993 | Kadomura | 437/192 |
| 5,254,498 | 10/1993 | Sumi | 437/190 |
| 5,326,723 | 7/1994 | Petro et al. | 437/192 |
| 5,434,104 | 7/1995 | Cain et al. | 437/198 |

*Primary Examiner*—Thorl Chea
*Attorney, Agent, or Firm*—George O. Saile; William J. Stoffel

[57] ABSTRACT

A process for preventing the formation of precipitates on a substrate surface after a contact layer (e.g., tungsten layer) etch back. The process involves removing the precursor chemicals of the precipitate. In one embodiment of the invention, the precursors are removed after etching contact layer by rinsing the substrate in water at about 30° C. for about 10 minutes. In a second embodiment of the invention, the precursors are removed by baking the substrate at a temperature of approximately 120° C. for approximately 180 seconds.

29 Claims, 2 Drawing Sheets

POST CONTACT LAYER ETCH BACK PROCESS WHICH PREVENTS PRECIPITATE FORMATION

BACKGROUND OF INVENTION

1) Field of the Invention

The present invention relates to the field of semiconductor fabrication and more particularly to metal-oxide-semiconductor (MOS) fabrication and to a process for preventing the formation of precipitates after a contact layer (e.g., a tungsten layer) etch back process.

2) Description of the Prior Art

To form semiconductor devices, it is often necessary to make contact to device regions through a dielectric layer. This is accomplished by first forming an opening or via (contact via) in the dielectric layer over the region to be contacted, and next filling the contact via with a conductive material.

In addition to filling the vias with a conductive material, it is necessary to electrically connect certain device regions with others as well as to provide for electrical connections to external leads. These requirements are met by forming a wiring layer on the surface of the substrate. The wiring layer is formed by depositing a conductive material on top of the dielectric layer in which the vias have been formed. The conducive layer is then masked and etched to leave continuous lines of conductive material which make the appropriate connections between device regions. These lines are called interconnects.

Several conductive materials can be used as contact via fill. In larger geometry devices, the via fill (plugs) and interconnects are formed in the same metallization step. For instance, aluminum (Al) can be deposited on the entire substrate, as well as in the vias. The areas over the vias and interconnects are then masked with photoresist and the aluminum is then etched from the remaining exposed areas, leaving the vias filled with aluminum as well as forming interconnect lines on the surface of the dielectric layer.

As semiconductor devices have become smaller, the aspect ratio (ratio of height to width) of the vias to the device regions has greatly increased. Aluminum deposition alone has proved to be inadequate in devices with high aspect ratios. The problems encountered include poor step coverage, poor contact integrity, and inadequate polarity. To overcome these shortcomings, tungsten and other refractory metals are being used as a contact filling for devices with submicron contacts before aluminum deposition and patterning. For example, a blanket tungsten layer is deposited on the substrate surface and fills the via. Next, the tungsten layer is blanket etched back to remove the deposited tungsten from the surface of the substrate, leaving a tungsten contact filling (or plug) in the contact openings (or vias). An aluminum layer is then deposited, covering the substrate surface including the filled contact vias. This aluminum film is then patterned and etched to form the interconnect lines between devices.

In order to improve the reliability of the interconnects and contacts, it has become a widely accepted practice to deposit a barrier metal layer such as TiN, TiW, or the like within the contact hole using, for example, a sputter process. This barrier layer prevents undesirable reactions between the substrate material (e.g., Si) and the wiring material or between the dielectric layer (e.g., silicon oxide) or polysilicon and the wiring material (e.g., aluminum).

A problem with the current process of etching back a tungsten contact layer that is formed over a barrier layer such as a TiN layer (or any Ti containing layer) is that a precipitate often forms on the barrier layer or surface layer. This precipitate, often violet in color, can cause circuit failure by interfering with the metal and insulation layers formed over the TiN and precipitate. The precipitate can also cause reliability problems such as electro migration. In addition, the precipitate can cause metal peeling on a metal layer deposited over the precipitate.

Therefore, there is a need for a process to remove or prevent the formation of precipitates after tungsten etch back. This process optimally should be reliable, simple, fast, and inexpensive to implement.

Davis, U.S. Pat. No. 5,164,330 teaches tungsten etch back process for tungsten layers using a $NF_3$/Ar chemistry with three etch steps. This process reduces the amount of residue buildup in the etching reactor.

Kadomura, U.S. Pat. No. 5,227,337 discloses a two step tungsten etch back process where the first step uses $S_2F_2$ gas at the high temperature and $S_2F_2/H_2$ at a low temperature.

Petro et al. U.S. Pat. No. 5,326,723 teaches a method of cleaning a CVD process chamber used to deposit tungsten. The chamber undergoes an in-situ cleaning process with $NF_3$ and $H_2N_2$ plasmas.

Sumi, U.S. Pat. No. 5,254,498 discloses a method of forming a barrier metal structure in a contact hole to ensure good metal coverage by the metal. The invention forms an oxide layer over a metal barrier layer (e.g., W) in a contact hole and forming a contact metal over the oxide.

Woo, U.S. Pat. No. 4,833,099 teaches a $N_2$ anneal after a tungsten deposition but before forming an oxidation layer over the tungsten layer. The $N_2$ anneal inhibits the tungsten from reacting with oxygen in the oxidation step and allows the formation of a planar and uncontaminated oxide layer.

SUMMARY OF THE INVENTION

It is an object of this invention to provide a process to prevent the formation of precipitates on the surface of a wafer after a contact layer etch back.

It is another object of the present invention to provide a process prevent the formation of and/or to remove the precursors of precipitates from a substrate surface containing titanium after a contact layer etch back.

Accordingly, the present invention provides a process to prevent the formation of precipitates which form on a substrate surface. In the first embodiment of the present invention, a barrier layer containing titanium is deposited on the surface of the substrate. Next, a contact layer (e.g., a tungsten layer) is formed over the barrier layer. The contact layer is then etched back to form contact fills. Lastly, within 4 hours of the completion of the etch step, the substrate is rinsed with water for preferably at least 5 minutes to remove the precursors of the precipitates. Next, the wafer is spin dried. Preferably, the water is de-ionized water at about room temperature (about 30° C.). Next, a metal layer can be deposited and patterned on the substrate surface to form an interconnect layer.

In a second embodiment of the invention, a barrier layer containing titanium is deposited on the surface of the substrate. Next, a contact layer is formed over the barrier layer. The contact layer is then etched back. Within 4 hours of the completion of the etch back step, the substrate is baked to remove the precursor of the precipitates. Preferably, the bake is performed at approximately 120° C. for approximately 180 seconds. Next, a metal layer is deposited and patterned on the substrate surface to form an interconnect layer.

DETAILED DESCRIPTION OF THE PREFERRED EMBODIMENTS

According to the present invention, a method for preventing the formation of a precipitate on the a substrate surface is presented.

Figure 1:
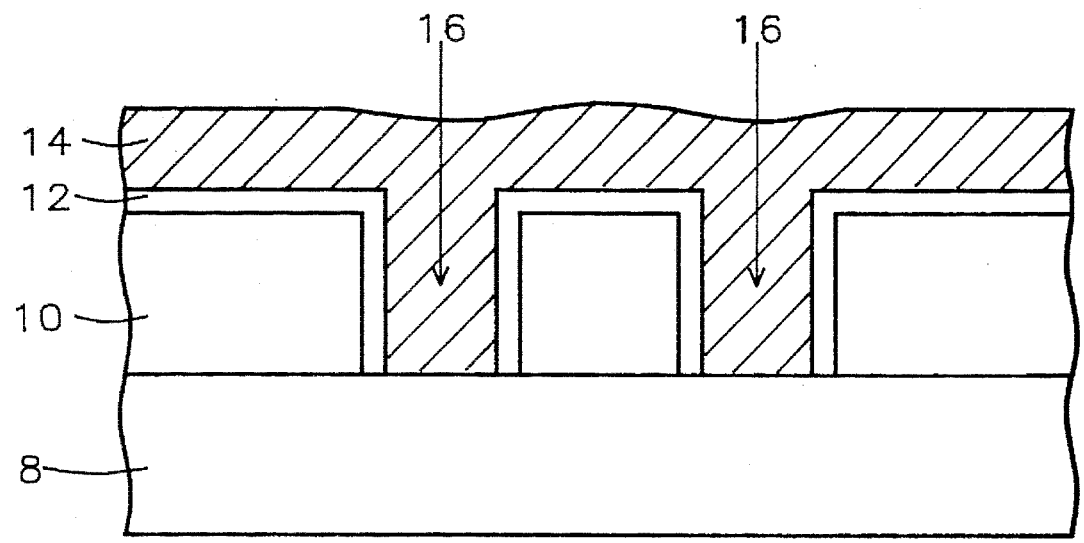
FIG. 1 shows a cross-sectional view of a wafer prior to contact layer etch back.

As shown in FIG. 1, various structures are formed in or on semiconductor substrate 8. These figures are shown for illustration purposes only and are not meant to limit the scope of the invention. Actual semiconductor devices will vary in their structure and complexity. The term substrate is meant to include the semiconductor wafer, the layers on a semiconductor wafer and devices underlying the wafer surface. The term substrate surface is meant to include the outermost exposed layer overlying the wafer.

The process for preventing the formation of precipitates on a Ti containing substrate surfaces can be used in any suitable application on any semiconductor device. On top of the substrate surface, an insulating layer 10 is formed. Insulating layer 10 can be formed of silicon oxide, Borophosphosilicate glass or silicon nitride. Contact openings 16 (vias) are formed in the insulating layer 10 as shown in FIG. 1. Next, a barrier layer 12 containing titanium, such as Titanium nitride (TIN), Ti, titanium silicide ($TiSi_x$) and TiW is formed on the surface of a semiconductor substrate 8. The barrier layer 12 can be form by any conventional process sputtering or reactive sputtering technique, such as sputtering Ti with $N_2$/Ar plasma. Barrier layer 12 can have a thickness in the range of 250 to 1500 Å.

Next, a contact layer 14 is deposited on the surface of a semiconductor wafer. Contact layer 14 can be formed of tungsten, aluminum, or copper and is preferably formed of tungsten. A tungsten contact layer can be formed using a conventional metal deposition process. A contact layer 14 comprised of tungsten can be form in a conventional chemical vapor deposition (CVD) process using a reactant gas of $WF_6$. A contact layer 14 can have a thickness in the range of 4000 to 9000 Å.

Figure 2:
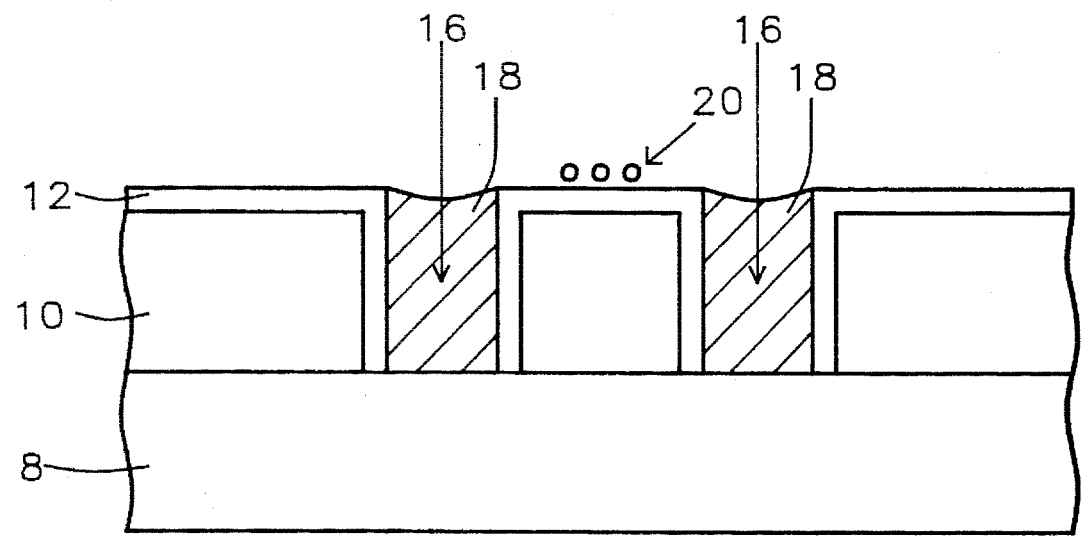
FIG. 2 shows a cross-sectional view of a wafer after the contact layer etch back and the formation of a precipitate on the substrate surface.

Then the contact layer 14 is etched back leaving the plugs (contact fills) 18 in the contact openings 16 as shown in FIG. 2. The etch is performed using a standard etch process such as a $SF_6$ plasma etch. The etch back can be performed on a LAM Research Equipment etcher model 4720 with a $SF_6$ flow rate of about 340 sccm, with a $N_2$ carrier flow rate of about 20 sccm, at temperature of about 40° to 60° C. and a pressure between 200 to 400 mtorr and more preferably at a pressure of about 300 mTorr and at a RF power between 200 and 300 W.

At this point, a precipitate 20 often appears on the substrate surface after the substrate is exposed to air as shown in FIG. 2. This precipitate 20 is often a violet or brown color and can cause serious yield and reliability problems such as electro migration. The precipitates can also cause metal peeling of subsequent overlying metal layers. In addition, the precipitates can cause bad adhesion between the metal layer 22 and the barrier layer 12 that reduces metal conductivity. See FIG. 3.

While the chemistry of the precipitate formation is not known for certain, it is theorized that the precipitate is the result of the following reaction mechanisms.

1) Tungsten contact layer etch back to barrier layer with $SF_6$ plasma in an etcher.

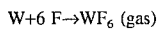

W+6 F→$WF_6$ (gas)

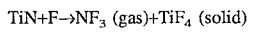

TiN+F→$NF_3$ (gas)+$TiF_4$ (solid)

2) $TiF_4$ will absorb moisture after exposing to the air and form Ti(OH)$F_3$+HF

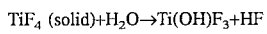

$TiF_4$ (solid)+$H_2O$→Ti(OH)$F_3$+HF

3) $Ti^{4+}$ (a colorless ion) is reduced to $Ti^{3+}$ (violet ion) by W through reduction-oxidation reactions.

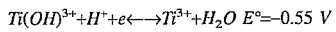

$Ti(OH)^{3+}+H^++e\leftarrow\rightarrow Ti^{3+}+H_2O$  $E°=-0.55$ V

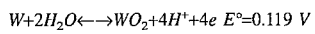

$W+2H_2O\leftarrow\rightarrow WO_2+4H^++4e$  $E°=0.119$ V

4) $TiF_3$ will absorb moisture to form a stable complex precipitate

$TiF_3$+6 $H_2O$→Ti(H2O)$_6F_3$ (precipitate)

From this analysis of the chemical mechanisms involved, $TiF_4$, W, and $H_2O$ are thought to be the precursors to form the precipitate. The two embodiments of the present invention were developed to remove the precursors ($TiF_4$ and $H_2O$) of the precipitate (Ti($H_2O$)$_6F_3$) from the wafer.

The first embodiment of the present invention is a rinse process which is theorized to remove the $TiF_4$ precursor thus preventing the formation of the precipitate. After the completion of the contact layer etch back step, the wafer is rinsed with water, preferably de-ionized (DI) water. The wafer should be rinse in water at least five minutes and preferably between about 5 and 10 minutes and more preferably for about 10 minutes. The water rinse should be in a temperature between 20° to 50° C. and more preferably be at about 30° C. The wafers can be rinsed in a conventional rinse tank with circulating filter system. Next, the wafers are spun dry. For best results, the rinse should be performed within 4 hours of the etch back. Depending on the conditions, after approximately 4 hours the precipitates start to form. However, the fully formed violet or brown precipitates are not readily removable using conventional chemical and mechanical cleaning processes.

Figure 3:
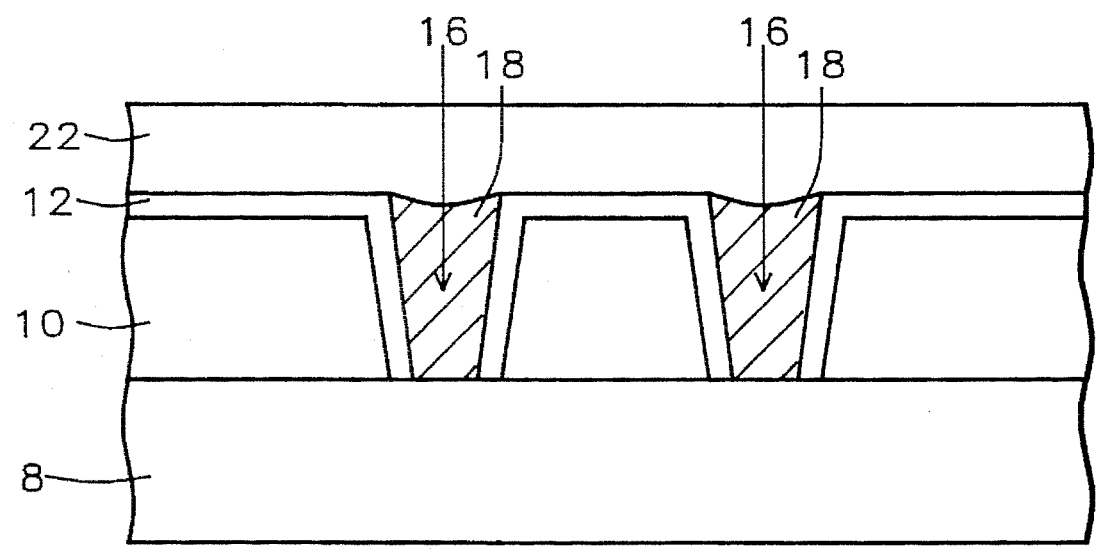
FIG. 3 shows a cross-sectional view of a wafer after the contact layer etch back and an overlying metal layer (i.e., interconnect layer).

After the rinsing of the wafers, a metal layer is deposited and patterned to form the interconnect layer 22 as shown in FIG. 3. The maximum time limit between rinsing the wafers and depositing the metal layer is between 4 to 24 hours and more preferably less than 8 hours.

The second embodiment of the present invention to prevent the formation of the precipitate is a hot bake process that is theorized to sublime the TiF$_4$ intermediate product thereby preventing the formation of the precipitate. Within 4 hours of the completion of the contact layer etch back, the wafers are baked at a temperature between 100° to 285° C. for between 90 and 180 seconds. More preferably, the wafers are baked at 120° C. for 180 seconds.

The hot bake should be performed less than 4 hours after the completion of the tungsten etch back to ensure that the precipitate does not form before the bake. The completely formed precipitate normally will not sublime at the hot bake temperatures. The minimum time between the completion of the etch back and the hot bake will depend on the environment the wafer are subjected to. The lower the humidity (water content) probably the longer the time allowed. The bake can be performed in a commercial hot plate, such as a Convac 6000 series hot plate. The hot bake can be at atmospheric pressure. The hot plate can have a N$_2$ purge and be at atmospheric pressure.

After the baking of the wafers, a metal layer is deposited and patterned to form the interconnect layer 22 as shown in FIG. 3. The time limit between baking the wafers and depositing the metal layer is between 4 to 24 hours and more preferably 8 hours. This time limit further ensures that no residual precipitate is formed.

The two embodiments of the present invention can be utilized in any process where a titanium containing surface is exposed to a water containing environment where a precipitate forms. The rinsing and baking processes may have to be optimized to the conditions of the environment and device structure, but the invention is applicable across a wide range of devices and device structures that include titanium. Any precipitate which occurs with the fluorine-based etching of a Ti-containing layer can be prevented by the present invention.

While the invention has been particularly shown and described with reference to the preferred embodiments thereof, it will be understood by those skilled in the art that various changes in form and details may be made without departing from the spirit and scope of the invention.

What is claimed is:

1. The method of preventing a formation of precipitates after etching back a contact layer on a surface of a substrate, the substrate surface including a barrier layer that contains titanium, the method comprising the steps of:

depositing a barrier layer containing titanium on the substrate surface, depositing a contact layer over said barrier layer, etching back said contact layer with a fluorine containing gas to expose said barrier layer, and rinsing the substrate with de-ionized water within 4 hours of the completion of the etching of the contact layer.

2. The method of claim 1 wherein said barrier layer containing titanium is formed of a material selected from the group consisting of TiN, Ti, TiSi$_x$ and TiW.

3. The method of claim 1 wherein said barrier layer containing titanium has a thickness in the range of 250 to 1500 Å.

4. The method of claim 1 wherein the etching of the contact layer is perform in plasma etcher at temperature in the range of 40° to 60° C., at a pressure between 200 and 400 mTorr, and with SF$_6$ and N$_2$ gases.

5. The method of claim 1 wherein the contact layer is formed of a material selected from the group consisting of tungsten, aluminum, and copper.

6. The method of claim 1 wherein the contact layer has a thickness in the range of 4000 to 9000 Å.

7. The method of claim 1 wherein the rinse with de-ionized water is performed for a time between about 5 to 10 minutes, at a water temperature between 20° to 50° C. and the water is deionized water.

8. The method of claim 1 wherein the method further includes forming an interconnect layer on the substrate surface after the rinsing of the substrate.

9. The method of claim 1 wherein the method further includes forming an interconnect layer on the substrate surface within 24 hours after the rinsing of the substrate surface.

10. The method of claim 1 wherein the substrate further includes an insulating layer having contact openings on the substrate surface.

11. The method of preventing a formation of precipitates after etching back a tungsten contact layer, the method comprising the steps of:

forming an insulating layer on a surface of a substrate, said insulating layer having a contact hole exposing said substrate surface;

depositing a barrier layer containing titanium over portions of said insulating layer;

depositing a tungsten contact layer over portions of said barrier layer and filling said contact hole, etching back said tungsten contact layer with a fluorine containing gas to expose portions of said barrier layer, and rinsing the substrate with water within 4 hours of the completion of the etching back of said tungsten contact layer.

12. The method of claim 11 wherein said barrier layer containing titanium is formed of a material selected from the group consisting of TiN, Ti, TiSi$_x$ and TiW.

13. The method of claim 11 wherein the barrier layer containing titanium has a thickness in the range of 250 to 1500 Å.

14. The method of claim 11 wherein the contact layer has a thickness in the range of 4000 to 9000 Å.

15. The method of claim 11 wherein the rinse with water is performed for a time between about 5 to 10 minutes, at a water temperature between 20° to 50° C. and the water is deionized water.

16. The method of claim 11 wherein the method further includes forming an interconnect layer on the substrate surface after the rinsing of the substrate.

17. The method of claim 11 wherein the method further includes forming an interconnect layer on the substrate surface within 24 hours after the rinsing of the substrate surface.

18. The method of preventing a formation of precipitates on a substrate surface after etching back a contact layer on a surface of a substrate, the substrate surface including a barrier layer containing Ti, the method comprising the steps of:

depositing a barrier layer containing titanium on the surface of the substrate, depositing a contact layer composed of tungsten over said barrier layer, etching back said contact layer with a fluorine containing gas to expose said barrier layer, and baking the substrate within 4 hours of the completion of etching said contact layer at a temperature in a range of 100° C. to 285° C.

19. The method of claim 18 wherein said barrier layer containing titanium is formed of a material selected from the group consisting of TiN, Ti, TiSi$_x$ and TiW.

20. The method of claim 18 wherein said barrier layer containing titanium has a thickness in the range of 250 to 1500 Å.

21. The method of claim 18 wherein the contact layer has a thickness in the range of 4000 to 9000 Å.

22. The method of claim 18 wherein the etching back of the contact layer is perform in plasma etcher with at temperature in the range of 40° to 60° C., at a pressure between 200 and 400 mTorr, and using $SF_6$ and $N_2$ gases.

23. The method of claim 18 wherein the bake is performed at a temperature in the range of 100° C. to 285° C. and for a time between 90 and 180 seconds.

24. The method of claim 18 wherein the hot bake is performed on a hot plate with a $N_2$ purge, at a temperature in the range of about 100° to 285° C. and for a time between about 90 and 180 seconds.

25. The method of claim 18 wherein the substrate further includes an insulating layer having contact openings on the substrate surface.

26. The method of claim 18 wherein the method further includes forming an interconnect layer on the substrate surface after the baking of the substrate.

27. The method of claim 18 wherein the method further includes forming an interconnect layer on the substrate surface within 24 hours after the baking of the substrate surface.

28. The method of preventing a formation of precipitates after etching back a tungsten contact layer, the method comprising the steps of:

forming an insulating layer on a surface of a substrate; said insulating layer having a contact hole exposing said substrate surface;

depositing a barrier layer containing titanium over portions of said insulating layer;

depositing a tungsten contact layer over portions of said barrier layer and filling said contact hole, etching back said tungsten contact layer with a fluorine containing gas to expose portions of said barrier layer thereby forming a tungsten plug in said contact hole, and rinsing the substrate with water within 4 hours of the completion of the etching back of said tungsten contact layer.

29. The method of preventing a formation of precipitates after etching back a tungsten contact layer, the method comprising the steps of:

forming an insulating layer on a surface of a substrate; said insulating layer having a contact hole exposing said substrate surface;

depositing a barrier layer containing titanium over portions said insulating layer;

depositing a tungsten contact layer over portions of said barrier layer and filling said contact hole, etching back said tungsten contact layer with a fluorine containing gas to expose portions of said barrier layer thereby forming a tungsten plug in said contact hole, and baking the substrate within 4 hours of the completion of etching said contact layer; the bake performed at a temperature in the range of 100° to 285° C.

* * * * *